United States Patent [19]

Kucharewski

[11] 4,307,306
[45] Dec. 22, 1981

[54] IC CLAMPING CIRCUIT
[75] Inventor: Nicholas Kucharewski, Lebanon, N.J.
[73] Assignee: RCA Corporation, New York, N.Y.
[21] Appl. No.: 39,882
[22] Filed: May 17, 1979
[51] Int. Cl.³ .................. H03K 17/687; H03K 3/08
[52] U.S. Cl. ................. 307/296 R; 307/562; 307/571; 307/592
[58] Field of Search ............ 307/237, 296 R, 251, 307/215, 562, 560, 592, 571; 328/48; 364/707; 368/69, 70, 224, 225

[56] References Cited
U.S. PATENT DOCUMENTS

| | | | |
|---|---|---|---|
| 3,159,751 | 12/1964 | Bogdan, Jr. et al. | 307/237 |
| 3,191,067 | 6/1965 | Zimmerman | 307/215 |
| 3,303,843 | 2/1967 | Apple | 307/215 |
| 3,636,385 | 1/1972 | Koepp | 307/304 |
| 3,878,405 | 4/1975 | Sylvan | 307/215 |
| 4,094,139 | 6/1978 | Nomura et al. | 368/69 |
| 4,130,988 | 12/1978 | Scherrer et al. | 368/69 |

OTHER PUBLICATIONS

IBM Technical Disclosure Bulletin, vol. 13, No. 5, Oct. 1970, by W. Fischer et al., "Resistor-thick Oxide FET Gate Protection Device for Thin Oxide FET", pp. 1272 and 1273.

Primary Examiner—Stanley D. Miller, Jr.
Assistant Examiner—B. P. Davis
Attorney, Agent, or Firm—E. M. Whitacre; A. L. Limberg; E. P. Herrmann

[57] ABSTRACT

An integrated circuit having circuitry for clamping input terminals that remain unconnected after assembly into a system. A transistor is connected to clamp the input terminal to reference potential and provide regenerative feedback to a NAND circuit forming a latch which maintains the transistor on when the input terminal would otherwise be left floating. Alternatively, when the terminal is connected to supply potential, the transistor is maintained "off", precluding loss of power.

14 Claims, 4 Drawing Figures

IC CLAMPING CIRCUIT

This invention relates to integrated circuitry for establishing the potential on non-connected input bonding pads of large scale integrated field effect transistor circuits.

Electronic devices such as digital watches, hand calculators and electronic games for example, generally include an integrated circuit connected to a battery, various switches, and a display or other output device. The cost of the integrated circuit or IC is but a small part of the cost of the completed device. Because the IC cost is small, the device assembler can afford not to utilize all of the functional circuit options that may be available on a particular IC. For example, the timing IC for a digital watch may have the option of counting for either a 12 or a 24 hour clock cycle. To implement the 24 hour version a control terminal is connected to the supply potential; otherwise, the control terminal is left floating.

Floating input terminals, particularly in metal-oxide-semiconductor or MOS ICs have a tendency to charge to varying potentials as a consequence of static electrical charges. This charging may condition the floating terminal to inadvertently activate its corresponding circuitry. In anticipation of this phenomenon, IC manufacturers generally provide a high impedance connection from such a terminal liable to be left floating and a point of reference or supply potential to dissipate static charge. However, when the terminal is connected to supply potential to activate the particular option, the high impedance circuit passes supply current, dissipating energy. This condition is particularly undesirable where power is supplied from a limited source, such as a watch battery.

The present invention includes a transistor for clamping an IC input terminal to a reference potential on the condition the terminal is not connected to utilization circuitry, and which transistor is effectively disconnected on the occurrence of the terminal being energized. The clamp is so configured that no energy is required from the primary power source.

Figure 1:
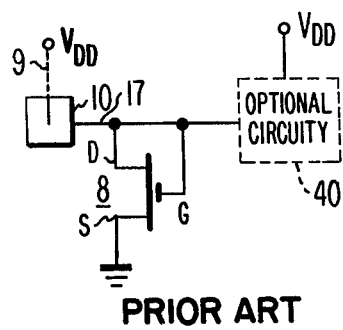
FIG. 1 is a prior art pull-down circuit.

Referring to the FIG. 1, the circuitry depicted is assumed to be a portion of an integrated circuit or IC fabricated on a monolithic die. The area 10 is a circuit input terminal or bond pad by which connection is made between the IC and other circuitry external to the IC. Connection 17 provides electrical communication between bond pad 10 and optional circuitry 40 contained on the IC. Bond pad 10 is of the type which is liable not to be connected when the IC is incorporated in an electronic system. In order to activate the optional circuit 40, bond pad 10 is connected to supply potential external to the IC via a connection 9.

Transistor 8 having its source electrode S connected to reference potential and its drain D and gate G electrodes connected to interconnection 17 is of the type which conducts when its gate-source potential increases toward supply potential $V_{DD}$ relative to reference. For $V_{DD}$ positive relative to the potential at the source electrode S, transistor 8 would be an n-channel device and for $V_{DD}$ negative relative to source potential transistor 8 would be a p-channel device. Thus if pad 10 is floating, i.e., has no external connection, and static electricity or IC leakage current tend to charge it to a potential in the direction of supply $V_{DD}$, the drain-source conduction path of transistor 8 will begin to conduct when the potential reaches the turn-on or threshold potential of the transistor. Once the transistor begins conducting the charging of pad 10 is inhibited and the optional circuitry 40 is prevented from inadvertent activation. The turn-on potential of transistor 8 is likely to be similar to the turn-on voltages of the transistors included in the circuitry of block 40. As such, the protection from inadvertent activation of 40 is marginal, or the noise immunity is low.

The drain-source impedance of transistor 8 is relatively high, to limit the current conducted under conditions of pad 10 being connected to $V_{DD}$. A typical drain-source impedance value for the diode-connected transistor 8 is several megohms, so that the input potential can easily override its clamping action. Despite the fact that current conducted by transistor 8 is extremely small, in the order of 100 nanoamperes, any loss of current is significant in battery operated systems, especially watches.

Figure 2:
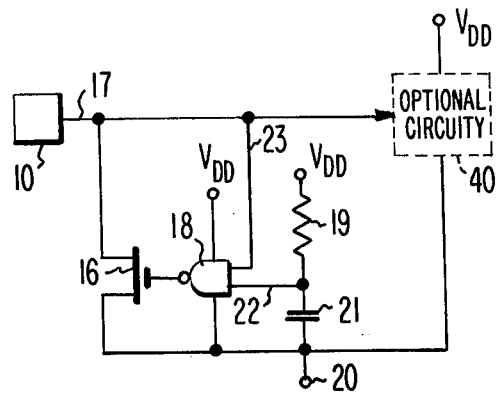
FIGS. 2 and 3 are schematic diagrams of embodiments of the invention.

The FIG. 2 circuit clamps pad 10 to reference potential 20 when it would otherwise float, while precluding the loss of shunted current when pad 10 is connected to $V_{DD}$. Transistor 16 having its drain electrode connected to connection 17 and its source electrode connected to reference potential 20 is selectively conditioned to conduct and clamp the bond pad 10 to reference potential. A control voltage applied to the gate electrode of transistor 16 from the output connection of NAND 18 is determinative of the selective conduction. The drain-source impedance of transistor 16 is high, so that an applied potential to pad 10 will not be overridden and clamped to reference potential.

NAND 18 having input connections 23 and 22 provides a logic "high" output potential sufficient to condition transistor 16 to conduct whenever the potential on either of its input terminals is at a logic "low". A logic "low" potential is equivalent to a range of potentials near the reference potential at 20. The clamping action of transistor 16 pulling connection 17 and NAND input 23 low completes a regenerative feedback circuit tending to latch connection 17 and pad 10 low to maintain circuit 40 inactive.

The output potential of NAND 18 swings substantially between $V_{DD}$ and reference corresponding to the logic "high" and "low" states respectively. Application of a logic "high" to the gate of transistor 16 drives it into the triode or nonlinear region of operation wherein its drain-source potential approaches zero volts absent a d-c current flow in its drain-source circuit. Thus if no positive potential is applied to pad 10 and transistor 16 is caused to conduct the potential on pad 10 will closely approach reference potential affording a greater certainty that functional circuitry 40 not be inadvertently activated.

The circuitry comprising resistor 19 and capacitor 21 connected to NAND input terminal 22 conditions NAND 18 to temporarily be in the "high" output state immediately after supply potential $V_{DD}$ is applied to the IC. The typical NAND circuit will change from a "high" output state to a "low" output state on an input potential excursion exceeding one-half the supply potential, or $V_{DD}/2$. Assuming that capacitor 21 is initially discharged prior to the application of power to the IC, the potential at NAND input terminal 22 will increase in conformance with $V_{DD}(1-\exp(-t/RC))$. The potential at input 22 will be in the logic "low" range for a time approximately equal to 0.7 RC where R is the resistance value of resistor 19 and C is the capacitance value of capacitor 21. For periods greater than 0.7 RC and as long as supply potential $V_{DD}$ is continuously applied, input 22 will be in the logic "high" condition. Therefore, upon application of supply potential, NAND 18 is guaranteed to exhibit a "high" output for a period of at least equal to 0.7 RC turning on transistor 16 to pull pad 10 to reference potential if pad 10 is floating. Once the potential on connection 17 is reduced to a logic low the circuit of transistor 16 and NAND 18 latches as aforementioned, keeping the pad 10 at reference potential unless a positive potential is applied to pad 10.

The RC circuit provides the proper initialization for the latching action of the circuit. If the pad 10 were statically charged to a "high" potential when the supply potential $V_{DD}$ is applied, the feedback via input 33 would be ineffectual to turn transistor 16 on and would tend to hold it off. Thus there is the need for the alternate input terminal to control NAND 18 initially.

Alternatively when pad 10 is connected to the $V_{DD}$ bus and the supply potential is applied to the IC, NAND 18 again generates an initial "high" output to cause transistor 16 to conduct. The drain-source impedance of transistor 16 when conducting, is arranged to be sufficiently high that the potential of connection 17 is not pulled out of the range of a logic "high". After the time period equivalent to RC, the potential at NAND input terminal 22 also becomes a logic high, causing the output of NAND 18 to go "low" and turn transistor 16 off. The pull-down transistor 16 passes shunt current from the supply only for the initialization period determined by the RC time constant, thereby minimizing power dissipated in the pull-down circuit. This is especially true when NAND 18 is implemented with complementary MOS circuitry which dissipates no d-c power.

The resistive and capacitive component values of 19 and 21 respectively are to be determined in accordance with the "on" impedance of transistor 16 and the stray capacitance associated with pad 10 and connection 17. The period of the time constant RC must be of such duration to discharge static charge residing on the stray capacitor to a logic "low" potential level through the impedance presented by transistor 16 in an "on" condition.

The RC delay circuit illustrated in FIG. 2 is but one means for generating a temporary logic "low" potential at the second input of NAND 18. One should appreciate that other methods of generating a transient "low" potential may be utilized such as the inverted signal from a power-on-reset(POR) circuit which provides a reset pulse to specific circuitry when power is initially applied to an IC.

Figure 4:
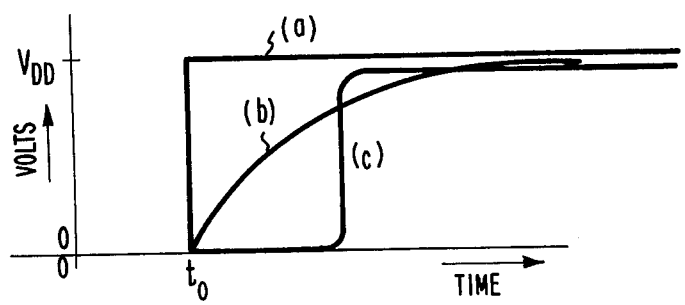
FIG. 4 is a time-voltage graph representing relative voltage relationships of circuit nodes in the FIG. 1 and 2 circuits.

The FIG. 4 time-vs.-voltage graph indicates the relationship of the potential at NAND input connection 22 for both the RC circuit and a POR with respect to application of supply potential $V_{DD}$. Curve (a) indicates the application of supply potential $V_{DD}$. Curve (b) illustrates the potential at NAND input 22 as a consequence of capacitor 21 charging and curve (c) illustrates the timing relationship of an inverted power-on-reset pulse that could be applied to input 21 in lieu of the potential generated by the RC circuit.

Figure 3:
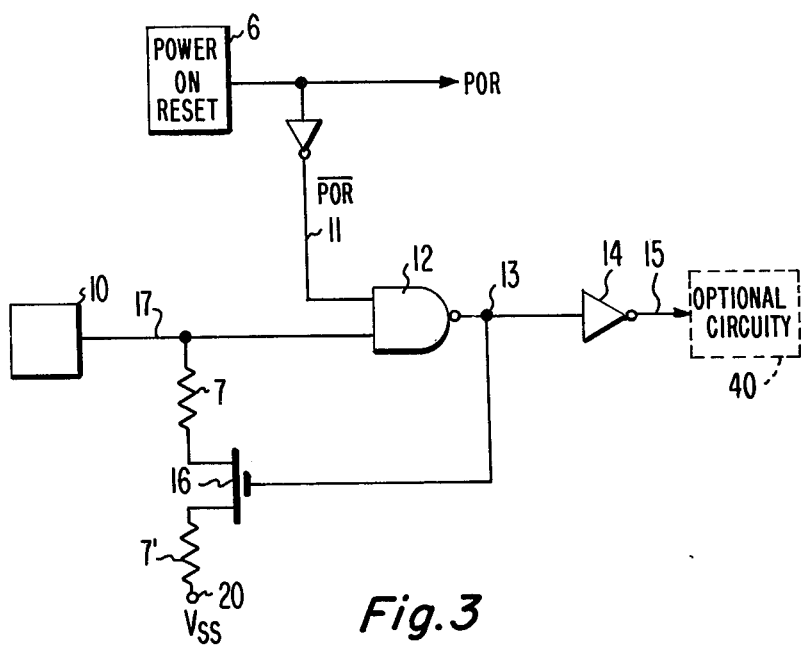

The FIG. 3 circuit controls the optional circuitry via a serial connection from pad 10 through NAND 12 and INVERTER 14. This arrangement precludes the control potential applied to circuit 40 from charging to an "on" level in the absence of supply potential, as may occur in the FIG. 2 circuit. The output potential of INVERTER 14 at connection 15 will remain "low" until a "low" potential is applied to its input connection 13 and supply potential is applied.

The two input NAND 12 has a first connection to bond pad 10 and clamping transistor 16 to form a regenerative latch with transistor 16 once the potential thereat is established at a logic "low". Resistors 7 are serially connected in the principal conduction path of transistor 16 to provide sufficient impedance that upon connection of pad 10 to supply potential, the supply potential will not be short circuited, i.e., loaded. A second input 11 is connected to a circuit for providing a temporary or transient "low" logic level to insure transistor 16 is turned on initially when power is applied to the circuit, which potential then remains at a "high" level as long as supply potential is continuously applied, such that the NAND 12 is controlled by the input potential at connection 17.

The NAND 12 and INVERTER 14 imposed between pad 10 and connection 15 effect a double inversion of the potential applied at pad 10. The logic level at connection 15 is thus "true" with respect to pad 10.

The FIG. 3 circuit provides, when the temporary signal at NAND input 11 is derived from a power-on-reset circuit, that the optional circuit 40 not be activated until after the reset function is accomplished.

While the invention has been described in terms of the particular embodiments illustrated, it should be appreciated that one skilled in the art of integrated circuits will readily conceive of numerous variations in the spirit of the invention, and the claims should be construed accordingly. For example, the clamping transistor 16 may be realized with a bipolar device and the transient input potential to the NAND circuit may be provided by a "one-shot". Further, the clamping transistor may be connected between $V_{DD}$ and the control terminal to clamp the control terminal to supply potential rather than reference potential. In this case the two input NAND circuit would be replaced with a two input NOR circuit, and the clamping transistor of the type that conducts for its control or gate potential tending toward reference potential.

What is claimed is:
1. In combination with an integrated circuit having first and second supply terminals and an input terminal liable to remain unconnected, further integrated circuitry comprising:
a transistor having first and second electrodes and a principal conduction path therebetween, a control electrode, potential between the control and the first electrode controlling said conduction path;
first and second means connecting the first and second electrodes of the transistor to the first supply terminal and said input terminal, respectively;
control means having an output terminal connected at the control electrode of said transistor, for generating a potential to condition said transistor to conduct responsive to the potential at said input terminal approaching the potential at the first supply terminal; and power on reset means for conditioning said transistor to conduct momentarily, immediately subsequent to applying a potential to said second supply terminal irrespective of the potential at said input terminal.

2. A combination as set forth in claim 1 further including a logic INVERTER circuit having an input connection at the output terminal of the control means and having an output connection from which logic signals are available substantially equal to a logical equivalent of potential applied to the input terminal.

3. A combination as set forth in claim 1 wherein the control means comprises:
a two-input LOGIC circuit having an output terminal connected to the control electrode of the transistor, having a first input connected to said input terminal, and having a second input terminal, said LOGIC circuit providing an output potential sufficient to condition said transistor to conduct whenever the potential on either or both of its inputs is at a potential substantially equal to potential applied to the first supply terminal and equivalent to a first logic potential; and
means for generating a first logic potential of a prescribed duration upon application of potential to the second supply terminal and a subsequent second logic potential thereafter, which first and second logic potentials are applied to the second input of the two-input LOGIC circuit.

4. A combination as set forth in claim 3 wherein the means for generating a first logic potential of a prescribed duration comprises:
a resistor having a first end connected to the second supply potential, and having a second end;
a capacitor having a first plate connected to the first supply terminal and having a second plate; and
means interconnecting the second end of said resistor, the second plate of said capacitor and the second input of said two input LOGIC circuit.

5. A combination as set forth in claim 3 wherein the means for generating a first logic potential of a prescribed duration comprises:
a power-on-reset circuit having an output terminal from which a second logic potential pulse of prescribed duration is available when power is applied to the second supply terminal; and
a logic INVERTER circuit having an input connected to the output terminal of the power-on-reset circuit and having an output terminal connected to the second input of the two input LOGIC circuit.

6. In an integrated circuit of the type having first and second supply terminals and functional circuitry with input control terminals which are either connected to supply potential to activate said functional circuitry to operate in a first mode or are caused to remain unconnected to enable said functional circuitry to operate in a second mode, an improved means for clamping the potential of said input terminal to potential at the first supply terminal with said input control terminal in the unconnected condition comprises:
a transistor having first and second electrodes and a principal conduction path therebetween, a control electrode, potential between the control and first electrode controlling the conduction path;
first and second means connecting the first and second electrodes of the transistor to the first supply and input control terminals respectively;
a two input NAND circuit having a first input connected to the input control terminal, an output connection connected to the control electrode of the transistor and having a second input connection; the NAND circuit being arranged to provide a first output potential sufficient to condition the transistor to conduct for either or both of its input connections exhibiting a potential more nearly equal to the potential applied to the first supply terminal than the potential applied to the second supply terminal and said NAND circuit providing an output potential sufficient to maintain the transistor cut off otherwise;
an INVERTER circuit having an input terminal connected to the output connection of the NAND circuit and having an output connection at which signals are available for controlling the functional circuitry, said signals being the same logical sense as the potential at the input control terminal;
initialization means for generating a first potential more nearly equal to the first supply potential than the second supply potential for a prescribed duration, subsequent to first and second supply potentials being applied to the first and second terminals, and a second potential being more nearly equal to the second supply potential than the first supply potential thereafter, as long as the first and second supply potentials are continuously applied; and
means for applying the potentials generated by the initialization means to the second input of said NAND circuit.

7. An integrated circuit as set forth in claim 6 wherein the initialization means comprises:
a resistor having a first end connected to the second supply terminal and having a second end;
a capacitor having a first plate connected to the first supply terminal and having a second plate; and
means interconnecting the second end of the resistive means, the second plate of the capacitor and the second input connection of the NAND circuit.

8. An integrated circuit as set forth in claim 1 or 6 wherein the first and second means connecting the first and second electrodes of the transistor to the first supply and input control terminals comprise first and second direct connections without substantial intervening impedance.

9. An integrated circuit as set forth in claim 1 or 6 wherein the first and second means connecting the first and second electrodes of the transistor to the first supply and input control terminals comprise first and second serially connected resistive means.

10. An integrated circuit as set forth in claim 1 or 6 wherein the first and second means connecting the first and second electrodes of the transistor to the first supply and input control terminals comprise a direct connection without substantial intervening impedance and a serially connected resistive means respectively.

11. An integrated circuit as set forth in claim 1 or 6 wherein the first and second means connecting the first and second electrodes of the transistor to the first supply and input control terminals comprise a serially connected resistance means and a direct connection without substantial intervening impedance respectively.

12. An integrated circuit as set forth in claim 1 or 6 wherein the transistor is a field effect transistor.

13. In combination, a circuit having a control terminal, said control terminal establishing one of a first and second modes of operation of a functional circuit in accordance with one of a first and second supply potentials applied thereto and wherein said control terminal is liable to remain unconnected to establish the other of the first and second modes of operation, further circuitry comprising:

a transistor having first and second electrodes and a principal conduction path therebetween, a control electrode; potential between the control and first electrodes controlling said conduction path;

means connecting the second electrode of the transistor to the control terminal;

means for connecting the control terminal to one of said first and second supply potentials to establish the mode of operation;

means connecting the first electrode of the transistor to the other of said first and second supply potential to which the control terminal is connected;

control circuitry having an output terminal connected at the control electrode of said transistor, for generating a potential to condition said transistor to conduct responsive to the potential at said control terminal and conditioning said transistor to conduct momentarily subsequent to applying supply potentials to the circuitry.

14. The combination as set forth in claim 13 wherein the control circuitry comprises:

a logic circuit having an output terminal connected to the control terminal of the transistor, having a first input connection connected to the control terminal and having a second input connection; said LOGIC circuit providing an output potential sufficient to condition said transistor to conduct whenever the potential on either or both of its input connections is at a potential substantially equal to the potential applied to the terminal to which the first electrode of the transistor is connected; and means for generating a potential pulse of a prescribed duration, said pulse having a potential value substantially equal to the potential applied to the first electrode of the transistor, which pulse is applied to the second input connection of said LOGIC circuit.

* * * * *